United States Patent
Ito

(10) Patent No.: US 9,881,819 B2
(45) Date of Patent: Jan. 30, 2018

(54) THERMAL PROCESSING APPARATUS FOR HEATING SUBSTRATE, AND SUSCEPTOR

(71) Applicant: SCREEN Holdings Co., Ltd., Kyoto (JP)

(72) Inventor: Yoshio Ito, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/174,519

(22) Filed: Jun. 6, 2016

(65) Prior Publication Data

US 2016/0284575 A1    Sep. 29, 2016

Related U.S. Application Data

(62) Division of application No. 14/176,709, filed on Feb. 10, 2014, now Pat. No. 9,390,947.

(30) Foreign Application Priority Data

Feb. 18, 2013  (JP) .................................. 2013-028799

(51) Int. Cl.
  *H01L 21/68*  (2006.01)
  *H01L 21/67*  (2006.01)
  (Continued)

(52) U.S. Cl.
  CPC ...... *H01L 21/67115* (2013.01); *H01L 21/677* (2013.01); *H01L 21/68* (2013.01); *H01L 21/6875* (2013.01); *H01L 29/045* (2013.01)

(58) Field of Classification Search
  CPC . H01L 21/67115; H01L 21/68; H01L 21/677; H01L 21/6875; H01L 29/045
  See application file for complete search history.

(56) References Cited

U.S. PATENT DOCUMENTS 6,063,196 A  *  5/2000  Li ....................... C23C 16/4583
                                                                118/712
2004/0018745 A1*  1/2004  Tashiro ................... H01L 21/68
                                                                438/758

(Continued)

FOREIGN PATENT DOCUMENTS

JP       H8-181083       7/1996
JP       H10-294287      11/1998
(Continued)

OTHER PUBLICATIONS

Japanese Office Action dated Oct. 18, 2016 with partial English translation of portions relevant to prior-art based rejections.

*Primary Examiner* — Benjamin Sandvik
*Assistant Examiner* — Farid Khan
(74) *Attorney, Agent, or Firm* — Ostrolenk Faber LLP

(57) ABSTRACT

A semiconductor wafer with (100) plane orientation has two orthogonal cleavage directions. A notch is provided so as to indicate one of these directions. During irradiation with a flash, the semiconductor wafer warps about one of two radii at an angle of 45 degrees with respect to the cleavage directions such that the upper surface thereof becomes convex, and the opposite ends of the other radii become the lowest position. Eight support pins in total are provided in upright position on the upper surface of a holding plate of a susceptor while being spaced at intervals of 45 degrees along the same circumference. The semiconductor wafer is placed on the susceptor such that any of the support pins supports a radius at an angle of 45 degrees with respect to a cleavage direction.

5 Claims, 12 Drawing Sheets

(51) Int. Cl.
*H01L 21/687* (2006.01)
*H01L 21/677* (2006.01)
*H01L 29/04* (2006.01)

(56) References Cited

U.S. PATENT DOCUMENTS

| | | | |
|---|---|---|---|
| 2006/0291835 A1 | 12/2006 | Nozaki | |
| 2007/0003259 A1* | 1/2007 | Kaihori | H01L 21/67248 392/416 |
| 2007/0059150 A1 | 3/2007 | Inoue | |
| 2008/0248657 A1* | 10/2008 | Nenyei | H01L 21/67115 438/799 |
| 2009/0175605 A1* | 7/2009 | Kobayashi | H01L 21/67115 392/416 |
| 2009/0191707 A1 | 7/2009 | Okada | |
| 2010/0168889 A1* | 7/2010 | Sekido | H01J 37/32431 700/97 |
| 2010/0200962 A1* | 8/2010 | Kihara | C30B 29/06 257/627 |
| 2012/0026498 A1 | 2/2012 | Picciotto et al. | |
| 2012/0034570 A1* | 2/2012 | Yasui | F27B 17/0025 432/1 |
| 2012/0067864 A1* | 3/2012 | Kusuda | H01L 21/67115 219/385 |
| 2012/0088203 A1 | 4/2012 | Mizunaga | |
| 2012/0269498 A1* | 10/2012 | Kang | F27B 17/0025 392/418 |
| 2012/0288261 A1* | 11/2012 | Hashimoto | F27B 17/0025 392/416 |
| 2012/0288970 A1* | 11/2012 | Hashimoto | H01L 21/67115 438/16 |
| 2013/0243550 A1* | 9/2013 | Yasui | H01L 21/67115 414/217 |
| 2014/0036274 A1* | 2/2014 | Marquardt | G01B 11/14 356/614 |

FOREIGN PATENT DOCUMENTS

| | | | | |
|---|---|---|---|---|
| JP | 2000-269223 | * | 9/2000 | H01L 21/324 |
| JP | 2008-205354 | * | 9/2008 | H01L 21/02 |
| JP | 2009-164451 | | 7/2009 | |

* cited by examiner

F I G. 4
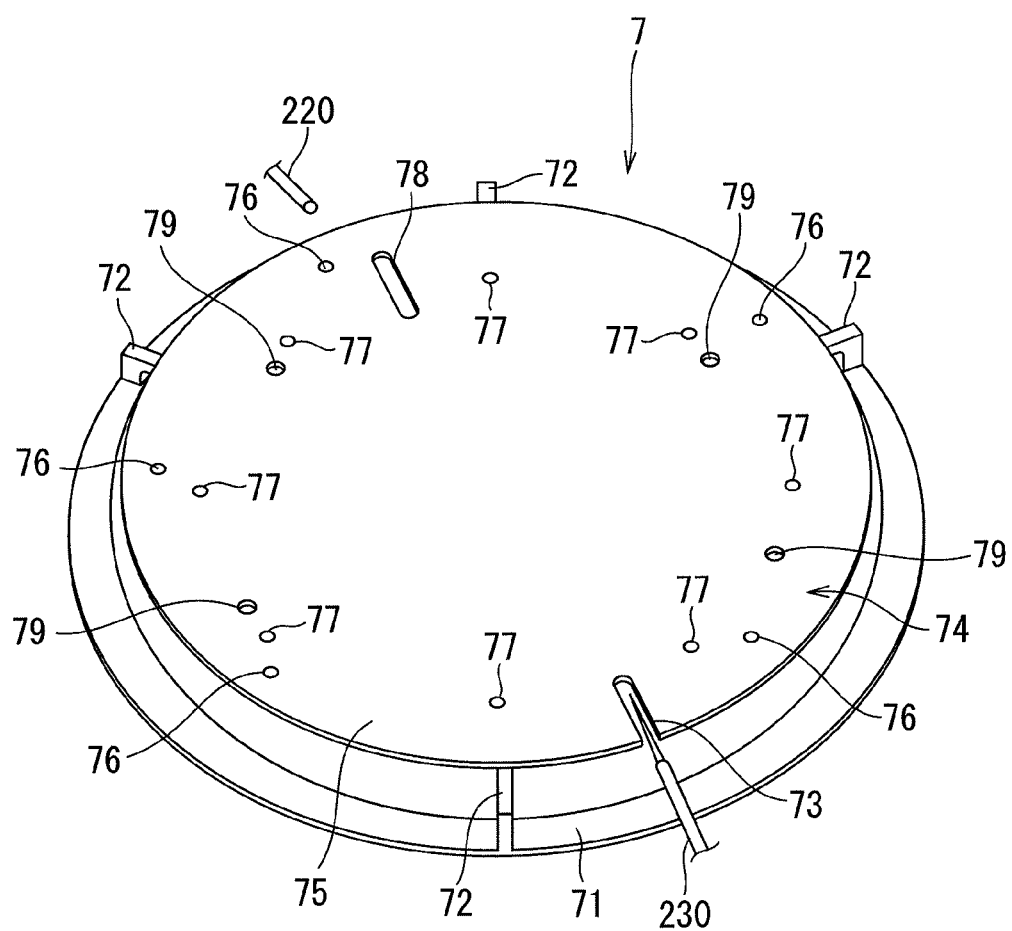

F I G. 1 0
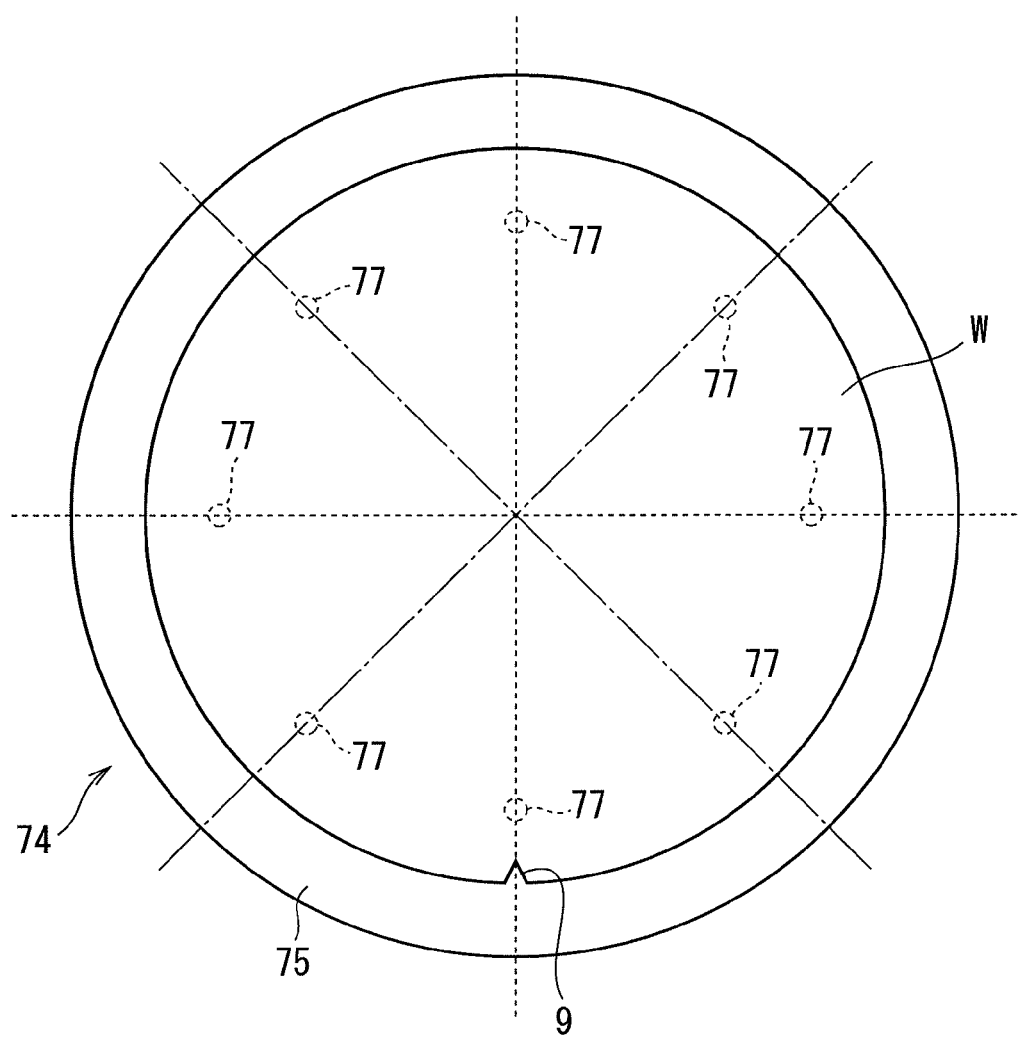

F I G. 1 1
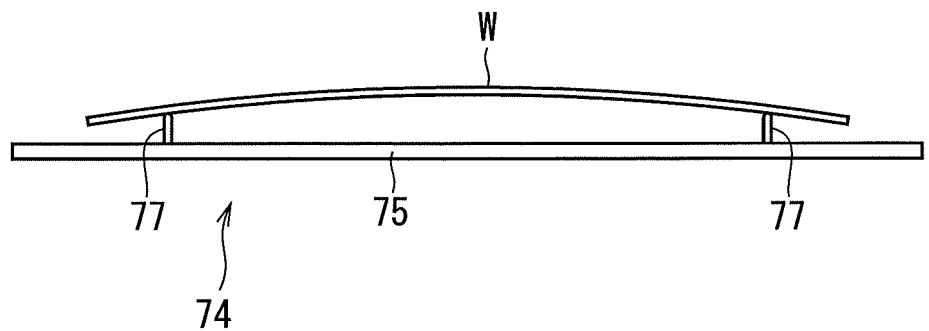

THERMAL PROCESSING APPARATUS FOR HEATING SUBSTRATE, AND SUSCEPTOR

CROSS-REFERENCE TO RELATED APPLICATIONS

This application is a divisional of U.S. patent application Ser. No. 14/176,709, filed Feb. 10, 2014, which claims the benefit of Japanese Patent Application No. 2013-028799, filed Feb. 18, 2013, incorporated herein by reference.

BACKGROUND OF THE INVENTION

Field of the Invention

The present invention relates to a thermal processing method and a thermal processing apparatus for heating a precision electronic substrate (hereinafter simply called a "substrate") shaped as a thin plate such as a semiconductor wafer of a circular plate shape by irradiating the substrate with a flash, and a susceptor on which the substrate is placed.

Description of the Background Art

Impurity introduction performed to form a pn junction in a semiconductor wafer is an essential step in manufacturing process of a semiconductor device. At present, impurities are introduced generally by ion implantation process and subsequent annealing process. The ion implantation process is a technique of implanting impurities physically by ionizing an impurity element such as boron (B), arsenic (As) or phosphorous (P) and making the impurity ions collide with the semiconductor wafer at a highly accelerated voltage. The implanted impurities are activated by the annealing process. If the annealing takes about several seconds or more, the implanted impurities are diffused deeply by heat and a resultant junction reaches a depth greater than is necessary. This might become an obstacle to favorable formation of the device.

Flash lamp annealing (FLA) has attracted attention in recent years as an annealing technique of heating a semiconductor wafer within an extremely short time. The flash lamp annealing is a thermal processing technique of increasing the temperature only of a surface containing implanted impurities of a semiconductor wafer within an extremely short time (several milliseconds or less) by irradiating the surface of the semiconductor wafer with a flash using a xenon flash lamp (in the below, a lamp simply called a "flash lamp" means a xenon flash lamp).

The spectral distribution of light emitted from a xenon flash lamp ranges from an ultraviolet region to a near-infrared region, has a shorter wavelength than light from a conventional halogen lamp, and substantially agrees with the base absorption band of a silicon semiconductor wafer. Thus, irradiating a semiconductor wafer with a flash from the xenon flash lamp does not produce much transmitted light so that the temperature of the semiconductor wafer can be increased rapidly. Additionally, it has become known that irradiation with a flash within an extremely short time of several milliseconds or less can increase the temperature only of a surface and its vicinity of the semiconductor wafer selectively. As a result, increasing a temperature within an extremely short time with the xenon flash lamp can realize only activation of impurities without causing deep diffusion of the impurities.

US 2009/0175605 discloses a thermal processing apparatus using such a xenon flash lamp. In this thermal processing apparatus, the flash lamp and a halogen lamp are arranged above and below a chamber respectively and desirable thermal processing is realized by a combination of these lamps. In the thermal processing apparatus of US 2009/0175605, a semiconductor wafer placed on a susceptor is preheated to a certain temperature with the halogen lamp, and is then heated to a desirable processing temperature by being irradiated with a flash from the flash lamp.

In the thermal processing apparatus of US 2009/0175605, six bumps (support pins) in total are provided on the quartz susceptor while being spaced at intervals of 60 degrees along the circumference of a circle of a given radius. A target semiconductor wafer is placed on the susceptor while being supported by point contact with the six bumps (six-point support). When the semiconductor wafer is placed on the susceptor with the six bumps and irradiated with a flash from the flash lamp, the temperature only of the upper surface of the wafer increases instantaneously to expand rapidly by heat. Hence, the semiconductor wafer warps such that the upper surface of the wafer becomes convex. This makes an edge portion of the semiconductor wafer contact the upper surface of the susceptor so the quartz in the contact area is scraped against the semiconductor wafer. This phenomenon disadvantageously causes a scar in the susceptor and makes the scraped quartz scatter as particles.

SUMMARY OF THE INVENTION

The present invention is intended for a thermal processing method that heats a substrate of a circular plate shape by irradiating the substrate with a flash.

According to one aspect of this invention, the thermal processing method includes the steps of: (a) placing a substrate on a susceptor on which a plurality of support pins is provided in upright position and supporting a lower surface of the substrate with the support pins; and (b) heating the substrate by irradiating an upper surface of the substrate on the susceptor with a flash from a flash lamp. The substrate is placed in the step (a) such that any of the support pins supports a radius connecting a portion of the substrate and the center of the substrate. The portion becomes the lowest position when the substrate warps in response to irradiation with a flash in the step (b) such that the upper surface of the substrate becomes convex.

The portion to become the lowest position when the substrate warps will not contact the susceptor, thereby preventing contact between an edge portion of the substrate and the susceptor during irradiation with a flash.

The present invention is also intended for a thermal processing apparatus that heats a substrate of a circular plate shape by irradiating the substrate with a flash.

According to one aspect of this invention, the thermal processing apparatus includes: an alignment mechanism that adjusts the position of a substrate; a susceptor on which a plurality of support pins is provided in upright position, the susceptor holding the substrate placed thereon while supporting a lower surface of the substrate with the support pins; a transport unit that transports the substrate from the alignment mechanism to the susceptor; and a flash lamp that heats the substrate placed on the susceptor by irradiating an upper surface of the substrate with a flash. The alignment mechanism is configured to adjust the position of the substrate such that any of the support pins supports a radius connecting a portion of the substrate and the center of the substrate. The portion becomes the lowest position when the substrate warps in response to irradiation with a flash from the flash lamp such that the upper surface of the substrate becomes convex.

The portion to become the lowest position when the substrate warps will not contact the susceptor, thereby preventing contact between an edge portion of the substrate and the susceptor during irradiation with a flash.

The present invention is further intended for a susceptor on which a substrate of a circular plate shape is placed. The substrate is heated by being irradiated with a flash from a flash lamp.

According to one aspect of this invention, the susceptor includes: a plate of a flat shape; and a plurality of support pins provided in upright position on an upper surface of the plate. The support pins support a lower surface of the substrate. The support pins are arranged at positions where the support pins support a radius connecting a portion of the substrate and the center of the substrate. The portion becomes the lowest position when the substrate warps in response to irradiation with a flash such that an upper surface of the substrate becomes convex.

The portion to become the lowest position when the substrate warps will not contact the upper surface of the plate during irradiation with a flash, thereby preventing contact between an edge portion of the substrate and the susceptor.

Thus, it is an object of the present invention to prevent contact between an edge portion of a substrate and a susceptor during irradiation with a flash.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a perspective view showing the appearance of an entire holding member;

FIG. 10 explains the position of a semiconductor wafer to be placed on the susceptor;

FIG. 11 shows the behavior of a semiconductor wafer placed on the susceptor during irradiation with a flash.

DESCRIPTION OF THE PREFERRED EMBODIMENTS

Figure 1:
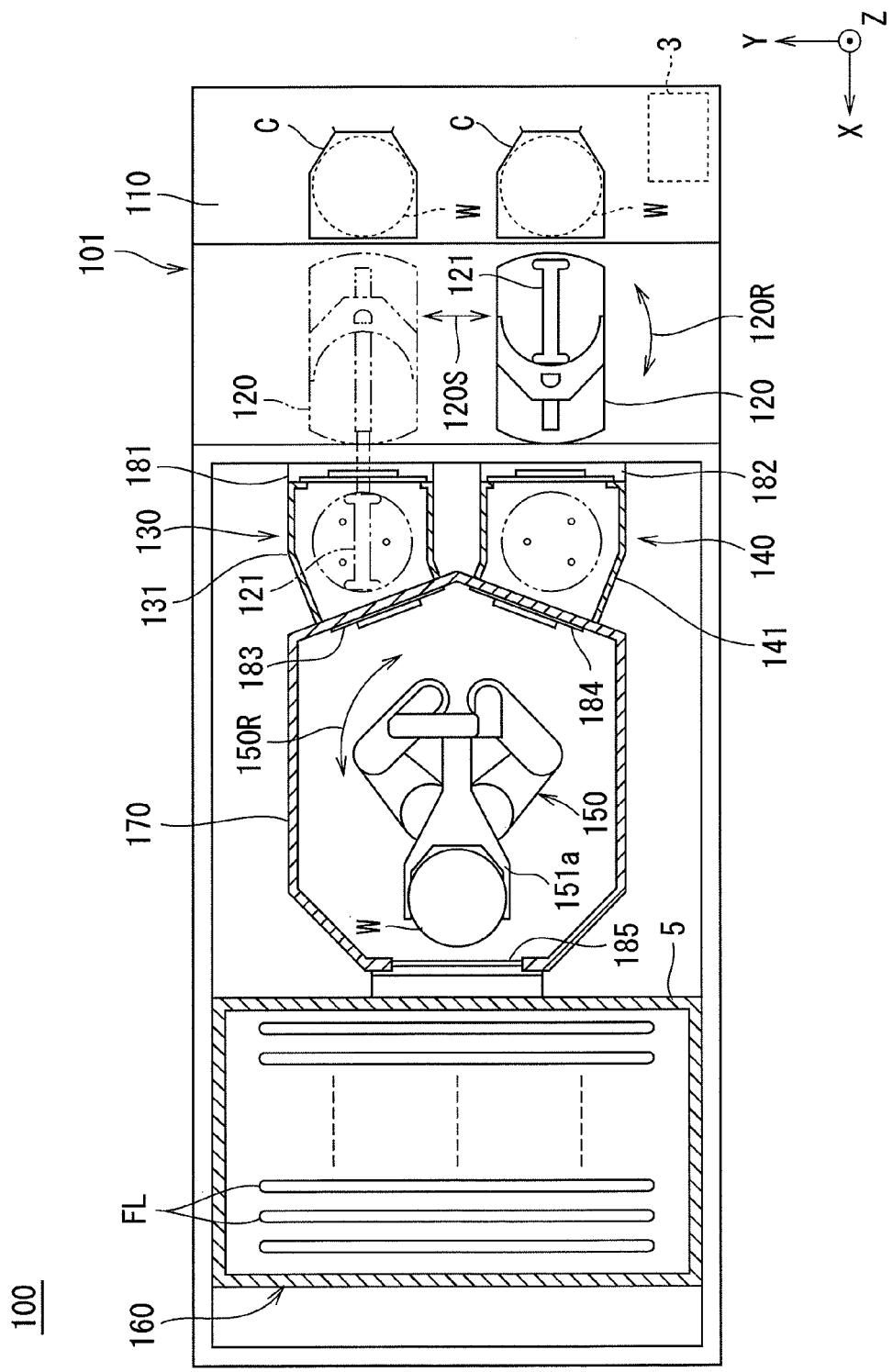
FIG. 1 is a plan view showing a thermal processing apparatus of the present invention.

A preferred embodiment of the present invention is described in detail below by referring to the drawings.

Figure 2:
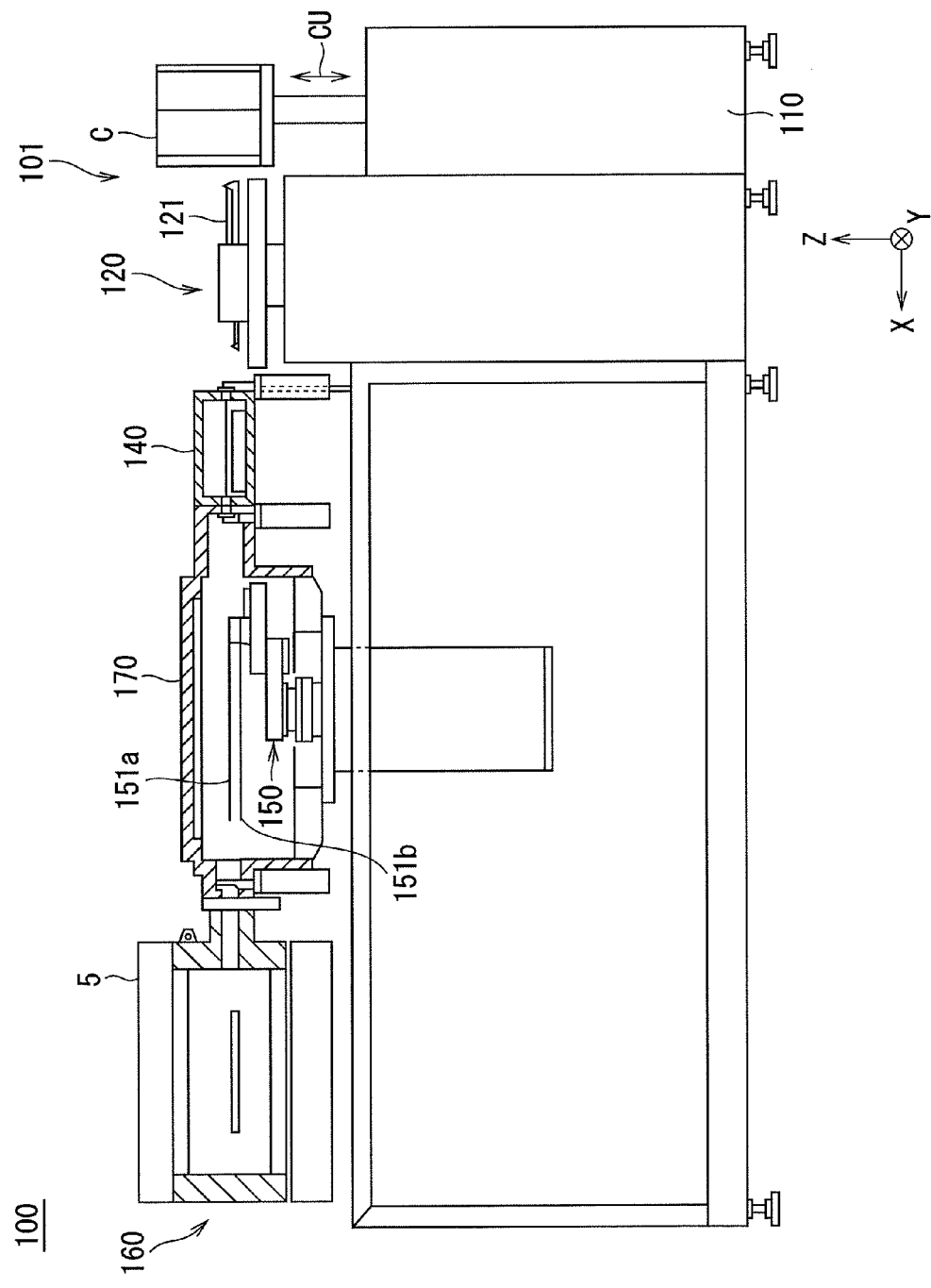
FIG. 2 is a front view of the thermal processing apparatus of FIG. 1.

An outline of the structure of an entire thermal processing apparatus 100 of the present invention is described briefly. FIGS. 1 and 2 are a plan view and a front view respectively showing the thermal processing apparatus 100 of the present invention. The thermal processing apparatus 100 is a flash lamp annealing apparatus that heats a semiconductor wafer W of a circular plate shape as a substrate by irradiating the semiconductor wafer W with a flash. Although not specifically limited, the size of a target semiconductor wafer W is 300 mm or 450 mm in diameter, for example. A semiconductor wafer W before being transported into the thermal processing apparatus 100 contains implanted impurities. The implanted impurities are activated by being heated in the thermal processing apparatus 100. In order to facilitate understanding, in FIG. 1 and its subsequent figures, the dimensions of components and the numbers of the components are exaggerated or simplified, where appropriate. In order to show relationships of directions among FIGS. 1 and 2 and their subsequent figures, an XYZ rectangular coordinate system defining a Z-axis direction as a vertical direction and defining an XY plane as a horizontal plane is given to FIGS. 1 and 2 and their subsequent figures, where appropriate.

As shown in FIGS. 1 and 2, the thermal processing apparatus 100 includes: an indexer unit 101 that transports an unprocessed semiconductor wafer W from the outside of the apparatus into the apparatus and transports a processed semiconductor wafer W to the outside of the apparatus; an alignment unit 130 that determines the position of an unprocessed semiconductor wafer W; a cooling unit 140 that cools a heated semiconductor wafer W; a flash heating unit 160 that performs flash heating process on a semiconductor wafer W; and a transport robot 150 that transports a semiconductor wafer W to the alignment unit 130, the cooling unit 140, and the flash heating unit 160. The thermal processing apparatus 100 further includes a controller 3 that proceeds with flash heating process on a semiconductor wafer W by controlling an operating mechanism in each of these units and the transport robot 150.

The indexer unit 101 includes a load port 110 where multiple (in this preferred embodiment, two) carriers C are arranged side by side, and a transfer robot 120 that unloads an unprocessed semiconductor wafer W from each carrier C and loads a processed semiconductor wafer W onto each carrier C. A carrier C housing an unprocessed semiconductor wafer W is transported into the load port 110 for example by an unmanned transport vehicle (such as AGV or OHT). A carrier C housing a processed semiconductor wafer W is taken out of the load port 110 by the unmanned transport vehicle. In the load port 110, in order to allow the transfer robot 120 to load and unload any semiconductor wafer W onto and from the carriers C, the carriers C are configured so as to be capable of moving up and down as shown by an arrow CU of FIG. 2. An applicable form of the carriers C includes an FOUP (front opening unified pod) housing a semiconductor wafer W in hermetically sealed space, an SMIF (standard mechanical interface) pod, and an OC (open cassette) that exposes a semiconductor wafer W housed therein to external air.

The transfer robot 120 is capable of making sliding movement as shown by an arrow 120S of FIG. 1, pivoting motion as shown by an arrow 120R of FIG. 1, and is capable of moving up and down. In this way, the transfer robot 120 loads and unloads a semiconductor wafer W onto and from the two carriers C, and transfers and receives a semiconductor wafer W to and from the alignment unit 130 and the cooling unit 140. The transfer robot 120 loads and unloads a semiconductor wafer W onto and from the carriers C in response to sliding movement of a hand 121 and up-and-down movement of the carriers C. The transfer robot 120 transfers and receives a semiconductor wafer W to and from the alignment unit 130 or the cooling unit 140 in response to sliding movement of the hand 121 and up-and-down movement of the transfer robot 120.

The alignment unit 130 is a processor that rotates a semiconductor wafer W in a horizontal plane to place the semiconductor wafer W in a position appropriate for subsequent flash heating. The alignment unit 130 is composed of an alignment chamber 131 as an aluminum alloy casing, and mechanisms housed in the alignment chamber 131 including one for rotating a semiconductor wafer W while holding the semiconductor wafer W in a horizontal posture, and one for optically detecting a notch or an orientation flat formed in a peripheral area of the semiconductor wafer W. A semiconductor wafer W is transferred from the transfer robot 120 to the alignment chamber 131 such that the center of the wafer W is at a predetermined position. In the alignment unit 130, the semiconductor wafer W received from the indexer unit 101 is rotated with respect to the center of the semiconductor wafer W about an axis extending in a vertical direction to detect a notch and the like optically, thereby adjusting the position of the semiconductor wafer W.

The flash heating unit 160 as a principal unit of the thermal processing apparatus 100 is a processor that performs flash heating process on a preheated semiconductor wafer W by irradiating the semiconductor wafer W with bursts of light (flashes) from xenon flash lamps FL. The structure of the flash heating unit 160 is described in detail later.

The cooling unit 140 is composed of a cool chamber 141 as an aluminum alloy casing, and a metallic cooling plate and a quartz plate on the upper surface of the cooling plate that are housed in the cool chamber 141. A semiconductor wafer W in a state immediately after being heated in the flash heating unit 160 is at a high temperature, so that it is cooled on the quartz plate in the cooling unit 140.

The transport robot 150 has two link mechanisms each composed of multiple arm segments and capable of pivoting about an axis extending in the vertical direction as shown by an arrow 150R. A transport hand 151a and a transport hand 151b to hold a semiconductor wafer W are provided at the respective tips of the two link mechanisms. The transport hands 151a and 151b are spaced one above the other at a certain interval. The transport hands 151a and 151b are allowed to make linear sliding movement independently in the same horizontal direction by the respective link mechanisms. The transport robot 150 moves a base up and down where the two link mechanisms are provided to move the two transport hands 151a and 151b up and down while maintaining the certain interval between the transport hands 151a and 151b.

A transport chamber 170 housing the transport robot 150 is prepared as space for transport of a semiconductor wafer W by the transport robot 150. The alignment chamber 131, the cool chamber 141, and a chamber 6 in the flash heating unit 160 are coupled to the transport chamber 170. For transfer (load and unload) of a semiconductor wafer W between the transport robot 150 and the alignment chamber 131, the cool chamber 141 or the chamber 6 in the flash heating unit 160, both the transport hands 151a and 151b first pivot so as to face a counterpart of the transfer. After (or during) the pivoting, the transport hands 151a and 151b move up and down until one of the transport hands reaches a height to transfer and receive the semiconductor wafer W to and from the counterpart. Then, the transport hand 151a (151b) makes linear sliding movement in the horizontal direction to transfer and receive the semiconductor wafer W to and from the counterpart.

A gate valve 181 and a gate valve 182 are provided between the alignment chamber 131 in the alignment unit 130 and the indexer unit 101 and between the cool chamber 141 in the cooling unit 140 and the indexer unit 101 respectively. A gate valve 183, a gate valve 184, and a gate valve 185 are provided between the transport chamber 170 and the alignment chamber 131, between the transport chamber 170 and the cool chamber 141, and between the transport chamber 170 and the chamber 6 in the flash heating unit 160. For transport of a semiconductor wafer W in the thermal processing apparatus 100, these gate valves are opened and closed appropriately. In order to maintain cleanness inside the alignment chamber 131, the cool chamber 141 and the transport chamber 170, high-purity nitrogen gas is supplied to these chambers from a nitrogen gas supply unit (not shown in the drawings) and where appropriate, residual nitrogen gas is drawn through an exhaust pipe.

The controller 3 controls various operating mechanisms in the thermal processing apparatus 100. The hardware structure of the controller 3 is the same as that of a generally used computer. Specifically, the controller 3 includes a CPU responsible for various arithmetic operations, a ROM that is a read-only memory storing a basic program, a RAM that is a freely readable and writable memory storing various information, and a magnetic disk storing control software, data and the like. Execution of a certain processing program by the CPU of the controller 3 makes process go forward in the thermal processing apparatus 100. While the controller 3 is shown to be arranged in the indexer unit 101 in FIG. 1, it can be arranged at any place inside the thermal processing apparatus 100.

Figure 3:
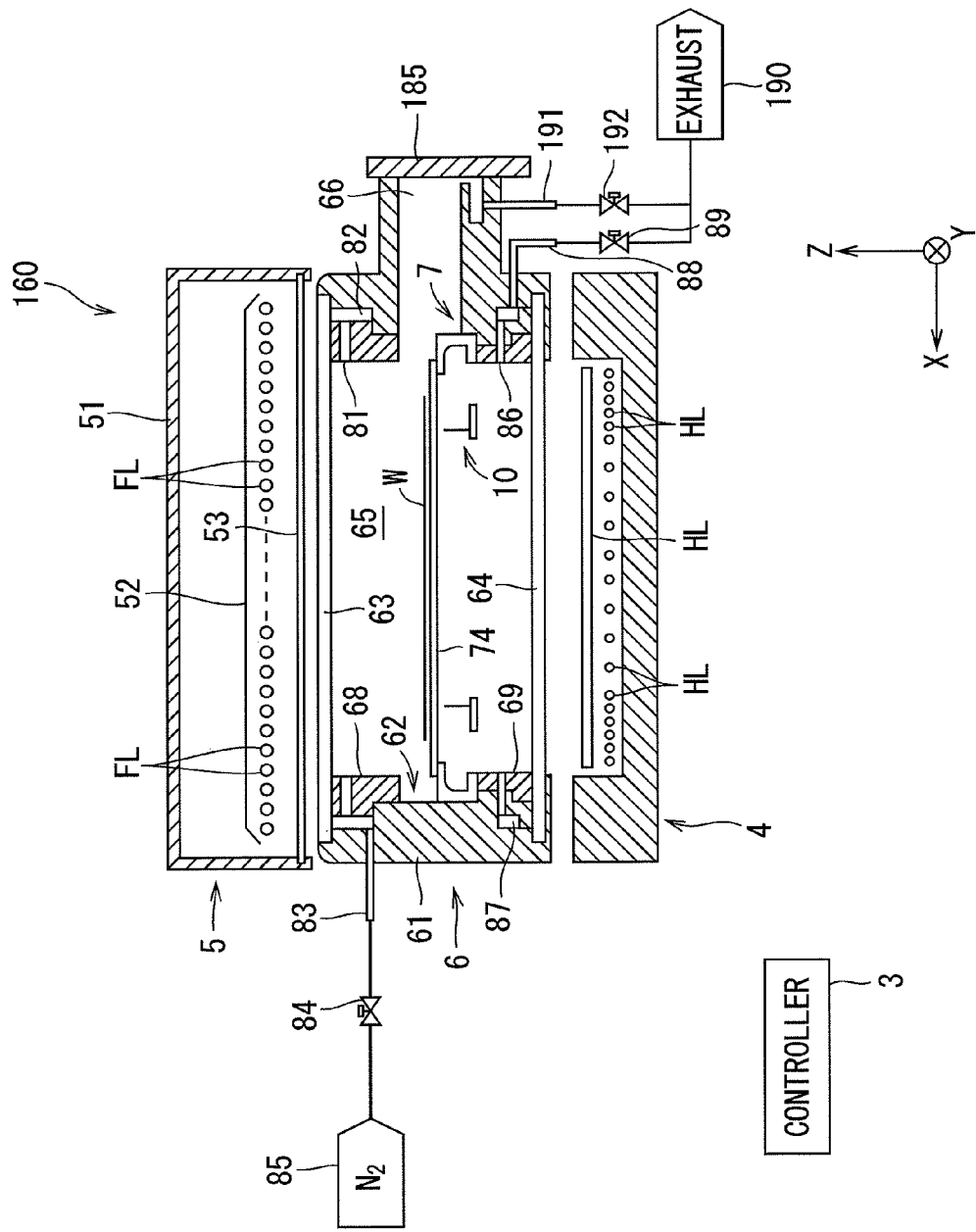
FIG. 3 is a vertical sectional view of a flash heating unit.

The structure of the flash heating unit 160 is described in detail next. FIG. 3 is a vertical sectional view showing the structure of the flash heating unit 160. The flash heating unit 160 includes the chamber 6 housing a semiconductor wafer W, a flash lamp house 5 housing multiple built-in flash lamps FL, and a halogen lamp house 4 housing multiple built-in halogen lamps HL. The flash lamp house 5 and the halogen lamp house 4 are arranged above and below the chamber 6 respectively. The flash heating unit 160 further includes inside the chamber 6 a holding member 7 that holds a semiconductor wafer W in a horizontal posture, and a transfer mechanism 10 for transfer of a semiconductor wafer W between the holding member 7 and the transport robot 150.

The chamber 6 is composed of chamber windows made of quartz attached to upper part and lower part of a columnar chamber side section 61. The chamber side section 61 is substantially columnar with upper opening and lower opening. An upper chamber window 63 is attached to the upper opening to close the upper opening. A lower chamber window 64 is attached to the lower opening to close the lower opening. The upper chamber window 63 forming a ceiling part of the chamber 6 is a circular plate member made of quartz. The upper chamber window 63 functions as a quarts window to cause flashes emitted from the flash lamps FL to reach the inside of the chamber 6. The lower chamber window 64 forming a floor part of the chamber 6 is also a circular plate member made of quarts. The lower chamber window 64 functions as a quarts window to cause light emitted from the halogen lamps HL to reach the inside of the chamber 6.

A reflection ring 68 and a reflection ring 69 are attached to upper part and lower part respectively of an inner wall surface of the chamber side section 61. The reflection rings 68 and 69 are both formed into an annular shape. The upper reflection ring 68 is attached to the chamber side section 61 by being fitted from above the chamber side section 61. The lower reflection ring 69 is attached to the chamber side section 61 by being fitted from below the chamber side section 61 and then fastened with a screw not shown in the drawings. Specifically, the reflection rings 68 and 69 are attached to the chamber side section 61 such that they can be removed from the chamber side section 61. Space inside the chamber 6, specifically space surrounded by the upper chamber window 63, the lower chamber window 64, the chamber side section 61, and the reflection rings 68 and 69 is defined as thermal processing space 65.

Attaching the reflection rings 68 and 69 to the chamber side section 61 forms a recessed part 62 in the inner wall surface of the chamber 6. Specifically, the recessed part 62 is surrounded by a central area of the inner wall surface of the chamber side section 61 not covered with the reflection rings 68 and 69, a lower end surface of the reflection ring 68, and an upper end surface of the reflection ring 69. The recessed part 62 is formed in the inner wall surface of the chamber 6 so as to extend in an annular pattern in the horizontal direction. The recessed part 62 surrounds the holding member 7 to hold a semiconductor wafer W.

The chamber side section 61 and the reflection rings 68 and 69 are made of a metallic material having excellent strength and resistance to heat (such as stainless steel). The inner circumferential surfaces of the reflection rings 68 and 69 are mirror surfaces plated with electrolytic nickel.

A transport opening section (furnace opening) 66 is provided in the chamber side section 61 through which a semiconductor wafer W is transported into and from the chamber 6. The transport opening section 66 can be opened and closed by a gate valve 185. The transport opening section 66 is communicatively connected to the outer circumferential surface of the recessed part 62. Thus, while the gate valve 185 opens the transport opening section 66, a semiconductor wafer W can be transported into and from the thermal processing space 65 through the transport opening section 66 and the recessed part 62. When the gate valve 185 closes the transport opening section 66, the thermal processing space 65 inside the chamber 6 becomes hermetically sealed space.

A gas supply hole 81 is formed in upper part of the inner wall of the chamber 6 through which processing gas (in this preferred embodiment, nitrogen gas ($N_2$)) is supplied into the thermal processing space 65. The gas supply hole 81 is formed above the recessed part 62 and may be formed in the reflection ring 68. The gas supply hole 81 is communicatively connected to a gas supply pipe 83 through buffer space 82 formed into an annular shape inside the side wall of the chamber 6. The gas supply pipe 83 is connected to a gas source 85. A valve 84 is interposed in a pathway of the gas supply pipe 83. Opening the valve 84 feeds nitrogen gas from the gas source 85 into the buffer space 82. The nitrogen gas having flown into the buffer space 82 spreads through the buffer space 82 lower in fluid resistance than the gas supply hole 81 and then flows into the thermal processing space 65 through the gas supply hole 81. The processing gas is not limited to nitrogen gas but it may also be a non-reactive gas such as argon (Ar) or helium (He), or may be a reactive gas such as oxygen ($O_2$), hydrogen ($H_2$), chlorine ($Cl_2$), hydrogen chloride (HCl), ozone ($O_3$), or ammonia ($NH_3$).

A gas exhaust hole 86 is formed in lower part of the inner wall of the chamber 6 through which gas is drawn out of the thermal processing space 65. The gas exhaust hole 86 is formed below the recessed part 62 and may be formed in the reflection ring 69. The gas exhaust hole 86 is communicatively connected to a gas exhaust pipe 88 through buffer space 87 formed into an annular shape inside the side wall of the chamber 6. The gas exhaust pipe 88 is connected to an exhaust unit 190. A valve 89 is interposed in a pathway of the gas exhaust pipe 88. Opening the valve 89 draws gas out of the thermal processing space 65 and discharges the gas into the gas exhaust pipe 88 through the gas exhaust hole 86 and the buffer space 87. The gas supply hole 81 and the gas exhaust hole 86 may each be formed in multiple spaces in the circumferential direction of the chamber 6, or they may be formed as slits. The gas source 85 and the exhaust unit 190 may be mechanisms prepared in the thermal processing apparatus 100, or may be utilities of a factory where the thermal processing apparatus 100 is placed.

A gas exhaust pipe 191 is connected to the tip of the transport opening section 66 through which gas is further drawn out of the thermal processing space 65. The gas exhaust pipe 191 is connected through a valve 192 to the exhaust unit 190. Opening the valve 192 draws gas out of the chamber 6 through the transport opening section 66.

Figure 5:
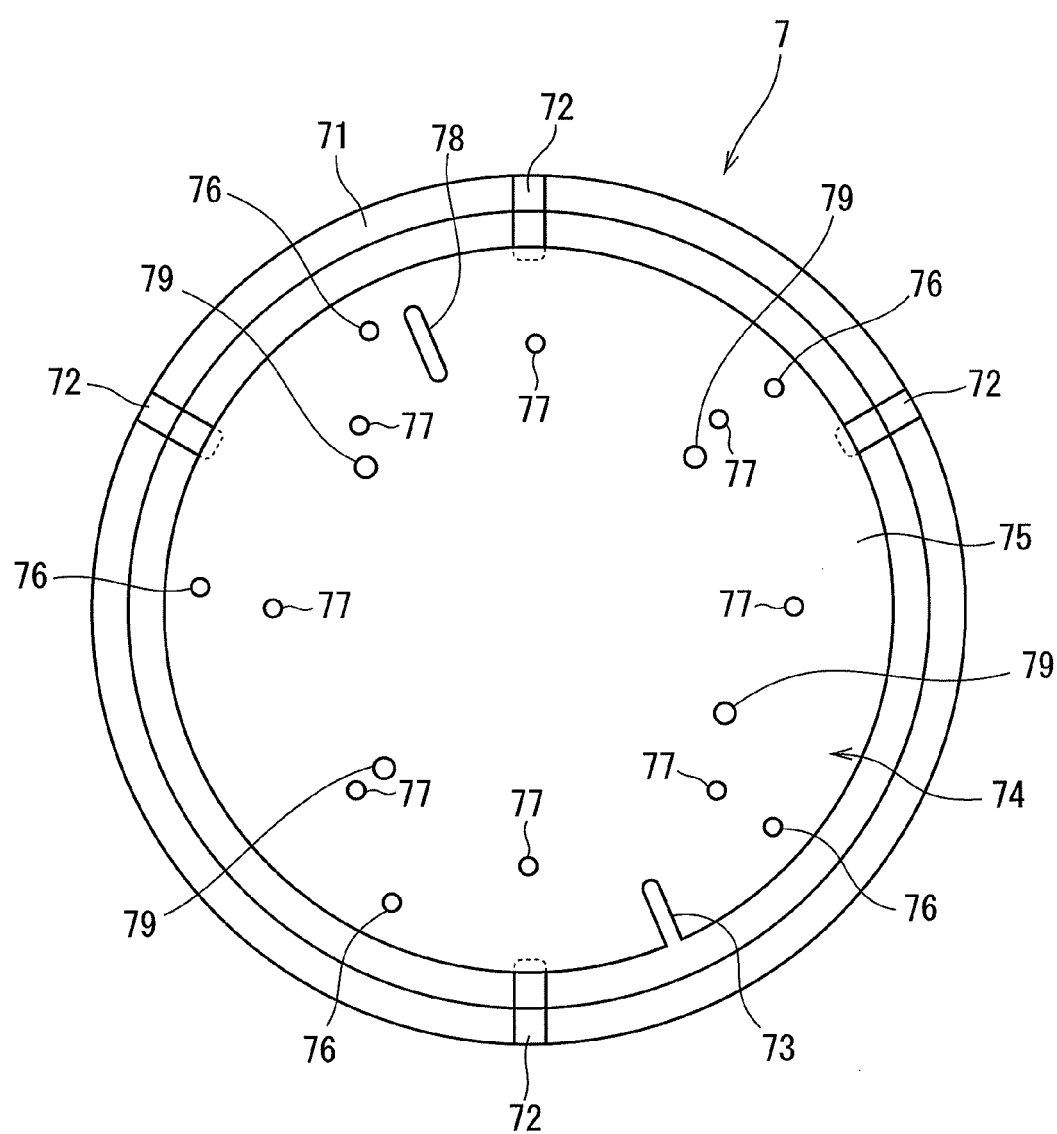
FIG. 5 is a plan view of a susceptor of the holding member as viewed from the upper surface thereof.
Figure 6:
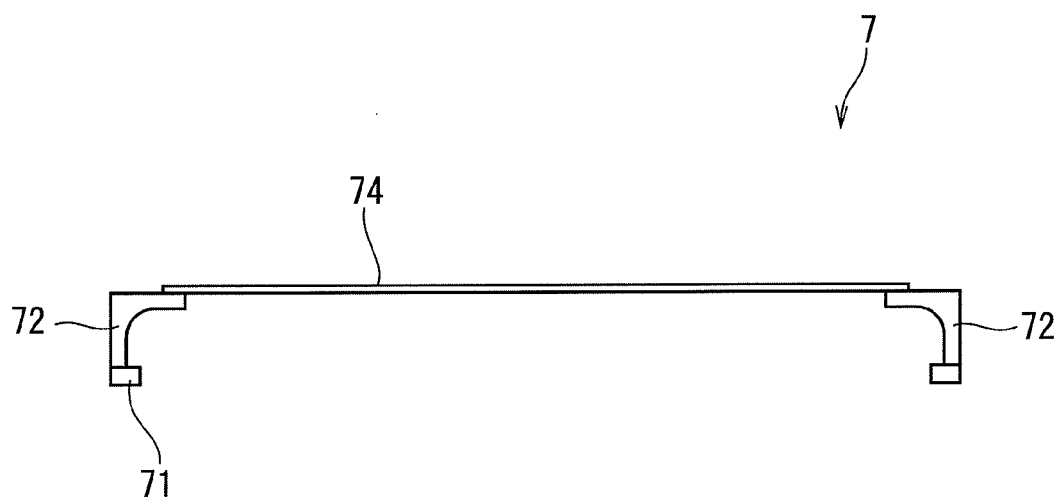
FIG. 6 is a side view of the holding member as viewed from a lateral side thereof.

FIG. 4 is a perspective view showing the appearance of the entire holding member 7. FIG. 5 is a plan view of a susceptor 74 of the holding member 7 as viewed from the upper surface thereof. FIG. 6 is a side view of the holding member 7 as viewed from a lateral side thereof. The holding member 7 is composed of a base ring 71, coupling sections 72, and the susceptor 74. The base ring 71, the coupling sections 72, and the susceptor 74 are all made of quartz. Specifically, the entire holding member 7 is made of quartz.

The base ring 71 is an annular quartz member. The base ring 71 is placed on the bottom surface of the recessed part 62, so that it is supported on the wall surface of the chamber 6 (see FIG. 3). The multiple (in this preferred embodiment, four) coupling sections 72 are provided in upright position on the upper surface of the annular base ring 71 so as to be arranged along the circumferential direction of the base ring 71. The coupling sections 72 are also quartz members and are fixedly attached by welding to the base ring 71. The base ring 71 may also be formed into a circular arc defined by forming a cut in part of an annular shape.

The susceptor 74 is supported with the four coupling sections 72 on the base ring 71. The susceptor 74 includes a holding plate 75 and multiple support pins 77. The holding plate 75 is a circular flat plate member made of quartz. The holding plate 75 is larger in diameter than a semiconductor wafer W. Specifically, the size of the holding plate 75 in a plane is larger than that of a semiconductor wafer W.

The support pins 77 are provided in upright position on the upper surface of the holding plate 75. In this preferred embodiment, the eight support pins 77 in total are provided in upright position while being spaced at intervals of 45 degrees along the circumference of a circle concentric with the outer circumferential circle of the circular holding plate 75. The diameter of the circle along which the eight support pins 77 are arranged (distance between opposite support pins 77) is smaller than the diameter of a semiconductor wafer W and is two-thirds or more of the diameter of the semiconductor wafer W. Specifically, if the diameter of a target semiconductor wafer W is 300 mm, the diameter of the circle along which the eight support pins 77 are arranged is not less than 200 mm but not exceeding 300 mm. If the diameter of the target semiconductor wafer W is 450 mm, the diameter of the circle along which the eight support pins 77 are arranged is not less than 300 mm but not exceeding 450 mm. All the support pins 77 are made of quartz. The support pins 77 can be arranged in upright position by being fitted in recesses formed in the upper surface of the holding plate 75.

Multiple (in this preferred embodiment, five) guide pins 76 are also provided in upright position on the upper surface of the holding plate 75. The five guide pins 76 are provided along the circumference of a circle concentric with the outer circumferential circle of the holding plate 75. The diameter of the circle along which the five guide pins 76 are arranged is slightly larger than the diameter of a semiconductor wafer W. Accordingly, the diameter of the circle along which the five guide pins 76 are arranged is larger than diameter of the circle along which the eight support pins 77 are arranged. All the guide pins 76 are also made of quartz. The number of the guide pins 76 is not limited to five but it may be any number that can prevent displacement of a semiconductor wafer W.

The four coupling sections 72 provided in upright position on the base ring 71 and a peripheral area of the lower surface of the holding plate 75 of the susceptor 74 are fixedly attached by welding. Specifically, the susceptor 74 and the base ring 71 are fixedly coupled to each other via the coupling sections 72. The base ring 71 of the holding member 7 is supported on the wall surface of the chamber 6, so that the holding member 7 is attached to the chamber 6. While the holding member 7 is attached to the chamber 6, the holding plate 75 of the susceptor 74 is placed in a horizontal posture (posture the normal line of which extends in the vertical direction). A semiconductor wafer W transported into the chamber 6 is placed and held in a horizontal posture on the susceptor 74 of the holding member 7 attached to the chamber 6. At this time, the semiconductor wafer W is placed on the susceptor 74 while the lower surface of the semiconductor wafer W is supported by point contact with the eight support pins 77 provided in upright position on the holding plate 75. Specifically, the eight support pins 77 support the semiconductor wafer W at a position spaced by a certain distance from the upper surface of the holding plate 75. The guide pins are higher than the support pins 77 76. This makes the guide pins 76 prevent displacement in the horizontal direction of a semiconductor wafer W supported with the support pins 77.

As shown in FIGS. 4 and 5, an opening area 78 and a cut 73 are formed in the holding plate 75 of the susceptor 74 so as to penetrate through the holding plate 75 vertically. The opening area 78 is provided to cause a radiation thermometer 220 to receive emitted light (infrared light) having passed through the lower surface of a semiconductor wafer W held on the susceptor 74. Specifically, the radiation thermometer 220 receives through the opening area 78 emitted light having passed through the lower surface of a semiconductor wafer W held on the susceptor 74, and a detector arranged in a different place measures the temperature of the semiconductor wafer W. The cut 73 is provided to let a probe tip of a thermocouple contact thermometer 230 pass therethrough. For temperature measurement, the contact thermometer 230 makes its probe contact the lower surface of a semiconductor wafer W through the cut 73. Four through holes 79 are further formed in the holding plate 75 of the susceptor 74 that penetrates through the holding plate 75. The through holes 79 are used for transfer of a semiconductor wafer W with lift pins 12 of the transfer mechanism 10 described later.

Figure 7:
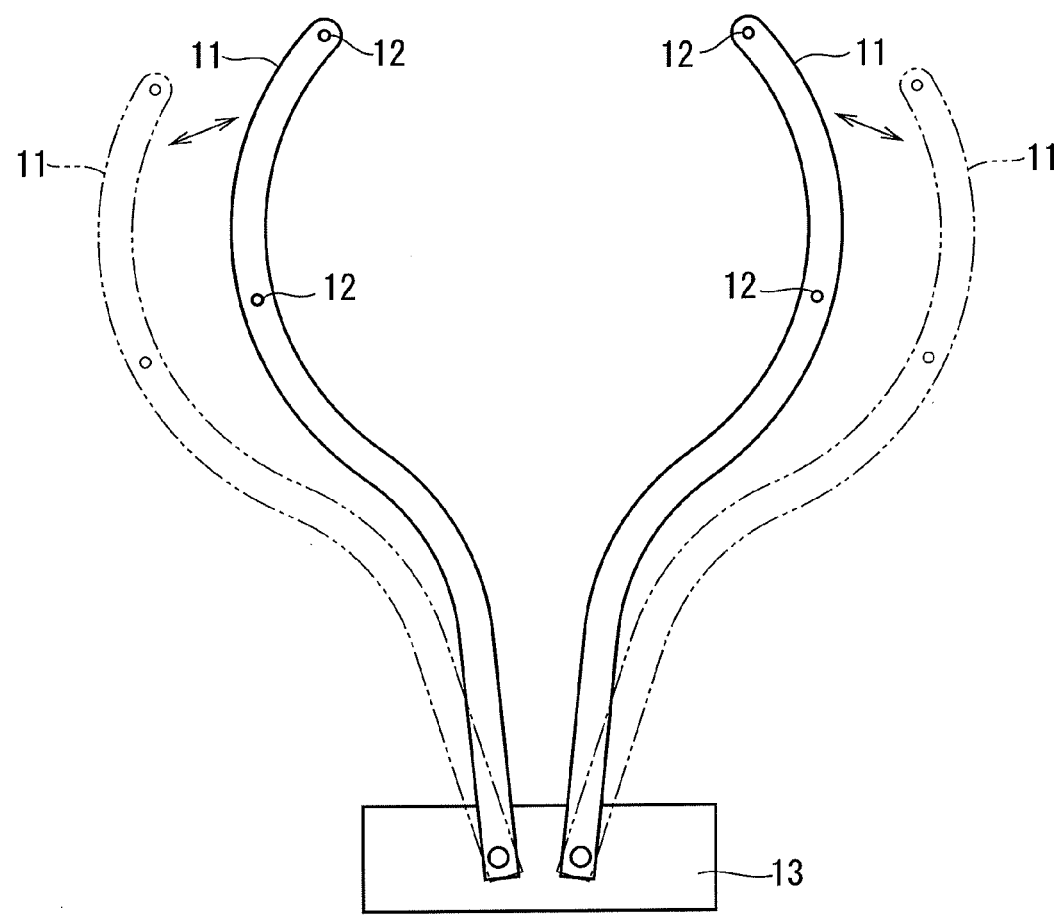
FIG. 7 is a plan view of a transfer mechanism.
Figure 8:
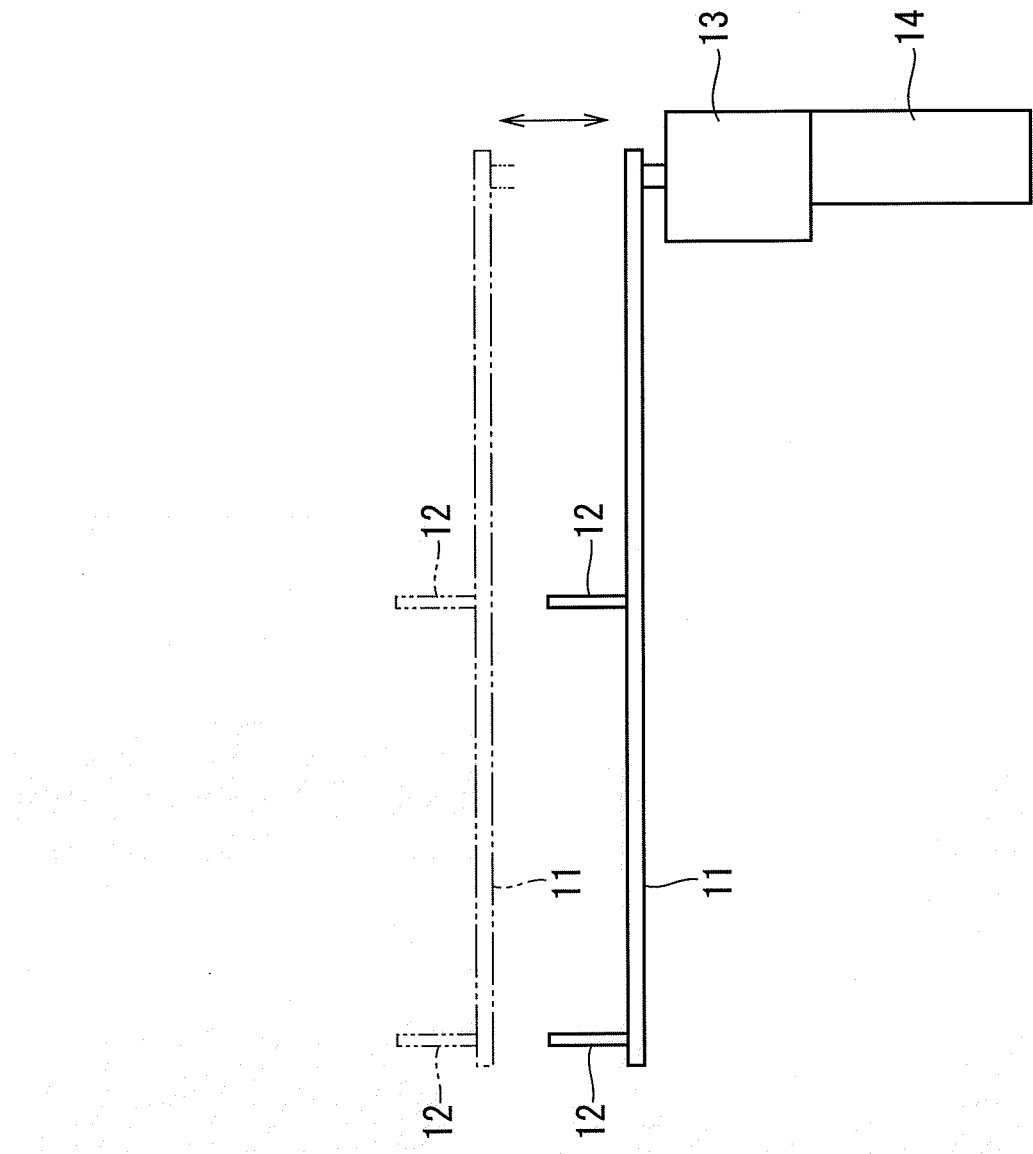
FIG. 8 is a side view of the transfer mechanism.

FIG. 7 is a plan view of the transfer mechanism 10. FIG. 8 is a side view of the transfer mechanism 10. The transfer mechanism 10 includes two transfer arms 11. The transfer arms 11 are formed into a circular arc conforming to the substantially annular shape of the recessed part 62. Two transfer pins 12 are provided in upright position on each of the transfer arms 11. Each of the transfer arms 11 can be caused to pivot by a horizontal movement mechanism 13. The horizontal movement mechanism 13 moves the transfer arms 11 in a pair horizontally between a transfer operating position (position with solid lines of FIG. 7) where a semiconductor wafer W is transferred to and received from the holding member 7, and a retracted position (position with alternate long and two short dashed lines of FIG. 7) that does not overlap a semiconductor wafer W held on the holding member 7 in plan view. The horizontal movement mechanism 13 may cause both the transfer arms 11 to pivot independently by using different motors, or may use a linking mechanism to cause the transfer arms 11 in a pair to pivot in an interlocked manner by using one motor.

The transfer arms 11 in a pair are moved up and down together with the horizontal movement mechanism 13 by an up-and-down mechanism 14. If the up-and-down mechanism 14 moves up the transfer arms 11 in a pair in the transfer operation position, the four lift pins 12 in total pass through the through holes 79 (see FIGS. 4 and 5) in the holding plate 75 of the susceptor 74 so that the upper ends of the lift pins 12 project from the upper surface of the holding plate 75. If the up-and-down mechanism 14 moves down the transfer arms 11 in a pair up in the transfer operating position, the lift pins 12 are extracted from the through holes 79. Then, the horizontal movement mechanism 13 moves the transfer arms 11 in a pair such that the transfer arms 11 become open, so that each of the transfer arms 11 moves to the retracted position. The retracted position of the transfer arms 11 in a pair is directly above the base ring 71 of the holding member 7. The base ring 71 is placed on the bottom surface of the recessed part 62, so that the retracted position of the transfer arms 11 is defined inside the recessed part 62. An exhaust mechanism not shown in the drawings is also provided in an area near the driving part (horizontal movement mechanism 13 and the up-and-down mechanism 14) of the transfer mechanism 10. This exhaust mechanism is configured to draw atmosphere around the driving part of the transfer mechanism 10 out of the chamber 6.

Referring back to FIG. 3, the flash lamp house 5 arranged above the chamber 6 includes a light source composed of multiple (in this preferred embodiment, 30) xenon flash lamps FL and a reflector 52 provided so as to cover the light source from above. The light source and the reflector 52 are arranged in a casing 51. A lamp light radiation window 53 is attached to the bottom of the casing 51 of the flash lamp house 5. The lamp light radiation window 53 forming a floor part of the flash lamp house 5 is a plate-like window made of quartz. Arranging the flash lamp house 5 above the chamber 6 makes the lamp light radiation window 53 face the upper chamber window 63. The flash lamps FL irradiate the thermal processing space 65 with flashes traveling from above the chamber 6 to reach the thermal processing space 65 through the lamp light radiation window 53 and the upper chamber window 63.

The flash lamps FL are each a bar-shaped lamp of an elongated cylindrical shape. The flash lamps FL are arranged in a plane such that the longitudinal directions thereof extend parallel to each other along a main surface of a semiconductor wafer W held on the holding member 7 (specifically, in the horizontal direction). Thus, a plane formed by the arrangement of the flash lamps FL becomes a horizontal plane.

The xenon flash lamps FL each include a bar-shaped glass tube (discharge tube) filled with xenon gas inside and having opposite ends with an anode and a cathode connected to a capacitor, and a trigger electrode provided on the outer circumferential surface of the glass tube. Xenon gas is an electrically insulating substance. Hence, even if electric charge is accumulated in the capacitor, electricity does not flow inside the glass tube in a normal condition. Meanwhile, if a high voltage is applied to the trigger electrode to cause electrical breakdown, electricity accumulated in the capacitor flows into the glass tube instantaneously to excite atoms or molecules of xenon, thereby emitting light. In these xenon flash lamps FL, electrostatic energy accumulated in advance in the capacitors is converted to an extremely short light pulse of from 0.1 to 100 milliseconds. Thus, the xenon flash lamps FL are characteristically capable of emitting extremely intense light compared to a light source such as the halogen lamps HL that are lighted continuously.

The reflector 52 is provided above the flash lamps FL so as to cover the flash lamps FL entirely. The basic function of the reflector 52 is to reflect flashes emitted from the flash lamps FL toward the thermal processing space 65. The reflector 52 is composed of an aluminum alloy plate, and has a surface (surface bordering the flash lamps FL) roughened as a result of blasting.

Figure 9:
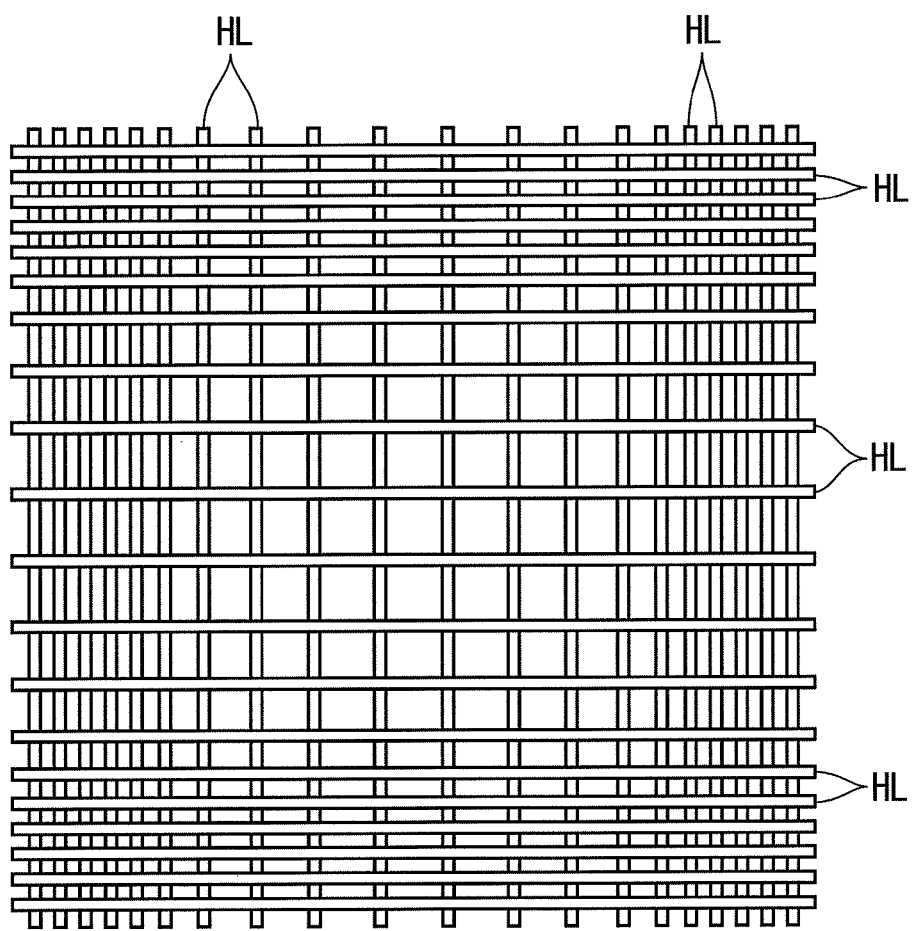
FIG. 9 is a plan view showing the arrangement of a plurality of halogen lamps.

The halogen lamp house 4 arranged below the chamber 6 includes multiple (in this preferred embodiment, 40) built-in halogen lamps HL housed in the halogen lamp house 4. The halogen lamps HL irradiate the thermal processing space 65 with light traveling from below the chamber 6 to reach the thermal processing space 65 through the lower chamber window 64. FIG. 9 is a plan view showing the arrangement of the halogen lamps HL. In this preferred embodiment, 20 halogen lamps HL are arranged in each of an upper tier and a lower tier. The halogen lamps HL are each a bar-shaped lamp of an elongated cylindrical shape. The 20 halogen lamps HL in each of the upper and lower tiers are arranged such that the longitudinal directions thereof extend parallel to each other along a main surface of a semiconductor wafer W held on the holding member 7 (specifically, in the horizontal direction). Thus, in each of the upper and lower tiers, a plane formed by the arrangement of the halogen lamps HL becomes a horizontal plane.

As shown in FIG. 9, in each of the upper and lower tiers, the halogen lamps HL are arranged more densely in a region facing a peripheral area of a semiconductor wafer W held on the holding member 7 than in a region facing a central area of the semiconductor wafer W. Specifically, in each of the upper and lower tiers, the pitch of the halogen lamps HL is shorter in a peripheral area of the lamp arrangement than in a central area thereof. This makes it possible to irradiate the peripheral area of the semiconductor wafer W with more light that is likely to cause temperature drop while being heated by irradiation with light from the halogen lamps HL.

A lamp group composed of the halogen lamps HL in the upper tier and a lamp group composed of the halogen lamps HL in the lower tier are arranged so as to cross each other in a grid pattern. Specifically, a total of 40 halogen lamps HL are arranged such that the longitudinal direction of each halogen lamp HL in the upper tier and the longitudinal direction of each halogen lamp HL in the lower tier become orthogonal to each other.

The halogen lamps HL are each a filament type light source that energizes a filament in a glass tube to make the filament incandescent, thereby emitting light. The glass tube is filled with gas inside containing inert gas such as nitrogen or argon and a halogen element (iodine or bromine, for example) introduced in minute amount into the inert gas. Introducing the halogen element allows the temperature of the filament to be set high while suppressing breakage of the filament. Thus, the halogen lamps HL are longer-life lamps than general incandescent bulbs, and are characteristically capable of emitting intense light continuously compared to general incandescent bulbs. The halogen lamps HL are long-life lamps for their bar shapes, and irradiate a semiconductor wafer W above the halogen lamps HL with excellent efficiency as a result of arrangement of the halogen lamps HL in the horizontal direction.

In addition to the aforementioned structures, the thermal processing apparatus 100 includes various cooling structures intended to prevent excessive temperature increase of the halogen lamp house 4, the flash lamp house 5 and the chamber 6 to be caused by heat energy generated from the halogen lamps HL and the flash lamps FL during thermal process on a semiconductor wafer W. By way of example, the wall of the chamber 6 is provided with a water-cooled tube (not shown in the drawings). The halogen lamp house 4 and the flash lamp house 5 are each configured as an air-cooled structure where heat is exhausted by a gas flow formed inside the structure. Further, air is supplied into a gap between the upper chamber window 63 and the lamp light radiation window 53 to cool the flash lamp house 5 and the upper chamber window 63.

Operation of the thermal processing apparatus 100 of the present invention in processing a semiconductor wafer W is described next. A semiconductor wafer W is typically shaped as a thin plate (a diameter of 300 mm and a thickness of 0.775 mm, for example) prepared by thinly slicing a cylindrical monocrystalline silicon ingot. Thus, a semiconductor wafer W processed in this preferred embodiment is made of monocrystalline silicon.

A semiconductor wafer W is prepared by slicing a silicon ingot according to a specific crystal orientation of the ingot. Three types of wafers are generally used including a wafer with (100) plane orientation, a wafer with (110) plane orientation, and a wafer with (111) plane orientation, of which a wafer with (100) plane orientation is used most frequently. In this preferred embodiment, a target semiconductor wafer W is a monocrystalline silicon wafer with (100) plane orientation. Impurities (impurity ions) are added by ion implantation process to the semiconductor wafer W with (100) plane orientation and these impurities are activated by heating process involving irradiation with a flash (annealing) performed by the flash heating unit 160. The procedure descried below taken by the thermal processing apparatus 100 proceeds while the controller 3 controls each operating mechanism in the thermal processing apparatus 100.

In the thermal processing apparatus 100, the carriers C are first placed in the load port 110 in the indexer unit 101 while multiple semiconductor wafers W containing implanted impurities are housed in the carriers C. Then, the transfer robot 120 unloads the semiconductor wafers W one by one from the carriers C and transports the semiconductor wafer W into the alignment chamber 131 in the alignment unit 130. When the semiconductor wafer W is transported into the alignment chamber 131, the gate valve 181 blocks communication between the alignment chamber 131 and the index unit 101. In the alignment unit 130, the semiconductor wafer W is rotated in a horizontal plane with respect to the center of the semiconductor wafer W about an axis extending in the vertical direction to optically detect a notch and the like, thereby adjusting the position of the semiconductor wafer W. The rotation and the adjustment of the position of the semiconductor wafer W in the alignment unit 130 are described in more detail later.

Next, the gate valve 183 permits communication between the alignment chamber 131 and the transport chamber 170. Then, the transport robot 150 transports the semiconductor wafer W having been adjusted in position from the alignment chamber 131 by the upper transport hand 151a. The transport robot 150 having received the semiconductor wafer W pivots so as to face the flash heating unit 160. After the semiconductor wafer W is transported from the alignment chamber 131, the gate valve 183 blocks communication between the alignment chamber 131 and the transport chamber 170.

Next, the gate valve 185 permits communication between the chamber 6 and the transport chamber 170 and the transport robot 150 transports the semiconductor wafer W into the chamber 6. At this time, if a semiconductor wafer W having been heated previously is present in the chamber 6, a target wafer is switched by unloading this heated semiconductor wafer W by the lower transport hand 151b and then transporting the unprocessed semiconductor wafer W into the chamber 6 by the upper transport hand 151a.

The semiconductor wafer W transported into the chamber 6 is subjected to flash heating process. The following describes the flash heating process in the flash heating unit 160.

Before the semiconductor wafer W is transported into the chamber 6, the valve 84 for gas supply is opened and the valves 89 and 192 for exhaustion are opened, thereby starting supply of gas into the chamber 6 and drawing of gas out of the chamber 6. Opening the valve 84 supplies nitrogen gas through the gas supply hole 81 into the thermal processing space 65. Opening the valve 89 draws gas out of the chamber 6 through the gas exhaust hole 86. As a result, the nitrogen gas supplied through an upper area of the thermal processing space 65 flows down and gas is drawn out of the thermal processing space 65 through a lower area of the thermal processing space 65.

Opening the valve 192 further draws gas out of the chamber 6 through the transport opening section 66. Further, the exhaust mechanism not shown in the drawings draws atmosphere around the driving part of the transfer mechanism 10. Nitrogen gas is supplied into the thermal processing space 65 continuously during thermal process on the semiconductor wafer W in the flash heating unit 160. The amount of the nitrogen gas to be supplied changes appropriately depending on a processing step.

Next, the gate valve 185 opens to open the transport opening section 66. Then, the transport robot 150 transports the unprocessed semiconductor wafer W into the thermal processing space 65 in the chamber 6 through the transport opening section 66. The transport robot 150 makes the transport hand 151a holding the semiconductor wafer W go forward to a position directly above the holding member 7 and stop there. Then, the transfer arms 11 in a pair of the transfer mechanism 10 move horizontally from the retracted position to the transfer operating position and move up. As a result, the lift pins 12 pass through the through holes 79 to project from the upper surface of the susceptor 74, so that the semiconductor wafer W is received from the transport hand 151a. At this time, the lift pins 12 have moved up to a position higher than the upper ends of the support pins 77 of the susceptor 74.

After the semiconductor wafer W is placed on the lift pins 12, the transport robot 150 makes the transport hand 151a exit the thermal processing space 65 and the gate valve 185 closes the transport opening section 66. Then, the transfer arms 11 in a pair move down to transfer the semiconductor wafer W from the transfer mechanism 10 onto the susceptor 74 of the holding member 7. The semiconductor wafer W is held from below in a horizontal posture on the susceptor 74.

The eight support pins 77 provided in upright position on the holding plate 75 support the lower surface of the semiconductor wafer W by point contact. This places the semiconductor wafer W in a horizontal posture on the susceptor 74. The semiconductor wafer W is placed on the susceptor 74 while a patterned surface with implanted impurities is placed as an upper surface. A certain gap is formed between the lower surface of the semiconductor wafer W supported with the eight support pins 77 and the upper surface of the holding plate 75. The semiconductor wafer W is held inside the five guide pins 76 on the upper surface of the holding plate 75 of the susceptor 74. The transfer arms 11 in a pair having moved down to a position below the susceptor 74 are moved by the horizontal movement mechanism 13 to the retracted position, specifically moved to a position inside the recessed part 62.

After the semiconductor wafer W is placed in a horizontal posture on the susceptor 74 of the holding member 7, the 40 halogen lamps HL turn on in unison to start preheating (assisted heating). Halogen light emitted from the halogen lamps HL passes through the lower chamber window 64 and the susceptor 74 both made of quartz to be applied to the semiconductor wafer W from the lower surface thereof. By being irradiated with the light from the halogen lamps HL, the semiconductor wafer W is preheated to increase in temperature. The transfer arms 11 of the transfer mechanism 10 have moved to a position inside the recessed part 62, so that they do not become an obstacle to the preheating with the halogen lamps HL.

During the preheating with the halogen lamps HL, the radiation thermometer 220 measures the temperature of the semiconductor wafer W. Specifically, the radiation thermometer 220 receives through the opening area 78 emitted infrared light having passed through the lower surface of the semiconductor wafer W held on the susceptor 74 to measure the temperature of the wafer W on the increase. The measured temperature of the semiconductor wafer W is transmitted to the controller 3. The controller 3 monitors the temperature of the semiconductor wafer W to increase in response to irradiation with light from the halogen lamps HL to see if this temperature has reached a given preheating temperature T1. The preheating temperature T1 is set from about 200° C. to about 800° C. and more preferably, from about 350° C. to about 600° C. (in this preferred embodiment, 600° C.) that can prevent diffusion by heat of the impurities added to the semiconductor wafer W.

After the temperature of the semiconductor wafer W reaches the preheating temperature T1, the controller 3 maintains the semiconductor wafer W at the preheating temperature T1 for a while. More specifically, when the temperature of the semiconductor wafer W measured with the radiation thermometer 220 reaches the preheating temperature T1, the controller 3 controls output of the halogen lamps HL to maintain the semiconductor wafer W at substantially the preheating temperature T1.

The aforementioned preheating with the halogen lamps HL increases the temperature of the entire semiconductor wafer W uniformly to the preheating temperature T1. In the stage of the preheating with the halogen lamps HL, the temperature of the semiconductor wafer W is more likely to drop in a peripheral area than in a central area as heat escapes more easily in the peripheral area than in the central area. Meanwhile, the halogen lamps HL in the halogen lamp house 4 are arranged more densely in a region facing the peripheral area of the semiconductor wafer W than in a region facing the central area of the semiconductor wafer W. Thus, the peripheral area of the semiconductor wafer W where heat escapes easily is irradiated with more light, so that an in-plane temperature distribution of the semiconductor wafer W can be uniform in the preheating stage. Further, the inner circumferential surface of the reflection ring 69 attached to the chamber side section 61 is a mirror surface. Thus, light in large quantity reflects off the inner circumferential surface of the reflection ring 69 to travel toward the peripheral area of the semiconductor wafer W. This achieves a more uniform in-plane temperature distribution of the semiconductor wafer W in the preheating stage.

When a predetermined time has elapsed after the temperature of the semiconductor wafer W reaches the preheating temperature T1, the flash lamps FL irradiate the upper surface of the semiconductor wafer W with flashes. At this time, some of the flashes from the flash lamps FL travel toward the inside of the chamber 6 directly, whereas the other flashes reflect off the reflector 52 once and then travel toward the inside of the chamber 6. The semiconductor wafer W is flash heated by being irradiated with these flashes.

The flash heating is performed by irradiation with flashes (bursts of light) from the flash lamps FL, so that the temperature of a surface of the semiconductor wafer W can be increased in a short time. Specifically, flashes emitted from the flash lamps FL are extremely short and intense bursts of light of extremely short light pulses converted from electrostatic energy accumulated in advance in the capacitors to be applied in a time of from about 0.1 to about 100 milliseconds. The temperature of the surface of the semiconductor wafer W flash heated by being irradiated with flashes from the flash lamps FL increases instantaneously to a processing temperature T2 of as high as 1000° C. or more to activate the impurities implanted in the semiconductor wafer W. Then, the temperature of the surface drops rapidly. In this way, the temperature of the surface of the semiconductor wafer W can be increased and reduced within an extremely short time. This allows activation of the impurities implanted in the semiconductor wafer W while suppressing diffusion of the impurities by heat. A time required for activation of the impurities is extremely shorter than a time required for diffusion of the impurities by heat. Thus, the activation is completed even in a short time of from about 0.1 to about 100 milliseconds that does not cause diffusion of the impurities.

After a predetermined time has elapsed after the flash heating process is finished, the halogen lamps HL turn off. As a result, the temperature of the semiconductor wafer W drops rapidly from the preheating temperature T1. The contact thermometer 230 or the radiation thermometer 220 measures the temperature of the semiconductor wafer W on the decrease and a result of the measurement is transmitted to the controller 3. The controller 3 monitors the temperature of the semiconductor wafer W based on the result of the measurement to see if this temperature has dropped to a given temperature. After the temperature of the semiconductor wafer W has dropped to the given temperature or lower, the transfer arms 11 in a pair of the transfer mechanism 10 again move horizontally to return to the transfer operating position from the retracted position and then move up. This makes the lift pins 12 project from the upper surface of the susceptor 74 to receive the thermally processed semiconductor wafer W from the susceptor 74. Next, the gate valve 185 opens the transport opening section 66 having been closed and the semiconductor wafer W on the lift pins 12 is transported by the lower transport hand 151b of the transport robot 150. The transport robot 150 makes the lower transport hand 151b go forward to a position directly below the semiconductor wafer W raised with the lift pins 12. Then, the transfer arms 11 in a pair move down so that the flash heated semiconductor wafer W is transferred to the transport hand 151b and placed there. Then, the transport robot 150 makes the transport hand 151b exit the chamber 6 to transport the semiconductor wafer W from the chamber 6.

The transport robot 150 having received the flash heated semiconductor wafer W with the transport hand 151b pivots from a position facing the chamber 6 to a position facing the cooling unit 140. Further, the gate valve 185 blocks communication between the chamber 6 and the transport chamber 170 and the gate valve 184 permits communication between the cool chamber 141 and the transport chamber 170.

Next, the transport robot 150 makes the transport hand 151b go forward to transport the semiconductor wafer W in a state immediately after the flash heating into the cool chamber 141 in the cooling unit 140. After the flash heated semiconductor wafer W is transported in the cool chamber 141, the gate valve 184 blocks communication between the cool chamber 141 and the transport chamber 170. In the cooling unit 140, the flash heated semiconductor wafer W is subjected to cooling process. The semiconductor wafer W is at a relatively high temperature at a time when it is transported from the chamber 6 in the flash heating unit 160. Hence, the semiconductor wafer W is cooled to room temperature or temperature near the room temperature. After a predetermined time of the cooling process has elapsed, the gate valve 182 permits communication between the cool chamber 141 and the indexer unit 101. Then, the cooled semiconductor wafer W is transported by the transfer robot 120 from the cool chamber 141 and is then returned to the carrier C. After processed semiconductor wafers W of a certain number are housed in the carrier C, the carrier C is transported from the load port 110 in the indexer unit 101.

The aforementioned irradiation with flashes increases the temperature of the upper surface of a semiconductor wafer W instantaneously to the processing temperature T2 of as high as 1000° C. or more whereas the temperature of the lower surface thereof at that instant does not increase much from the preheating temperature T1. Specifically, a large temperature difference occurs instantaneously between the upper and lower surfaces of the semiconductor wafer W. This makes only the upper surface of the semiconductor wafer W expand rapidly by heat while causing substantially no thermal expansion of the lower surface. As a result, the semiconductor wafer W warps instantaneously such that the upper surface thereof becomes convex. As is already described, this warpage makes an end portion (edge) of the semiconductor wafer W contact the upper surface of the holding plate 75 of the susceptor 74, leading to the fear of scraping of quartz.

In response, according to the thermal processing technique of the present invention, the support pin 77 supports a radius connecting a portion to become the lowest position when a semiconductor wafer W warps during irradiation with flashes and the center of the wafer W.

The present inventors conducted an intensive study on correlation between a direction in which a semiconductor wafer W warps during irradiation with flashes and a crystal orientation, and found out that in the case of a silicon semiconductor wafer W with (100) plane orientation, the semiconductor wafer W warps about a radius (line segment passing through the center of the circular semiconductor wafer W) at an angle of 45 degrees with respect to a cleavage direction such that the upper surface of the semiconductor wafer W becomes convex. Specifically, during irradiation with flashes, the semiconductor wafer W warps downward at both semicircular arcs formed by a radius at an angle of 45 degrees with respect to a cleavage direction while this radius becomes the highest position. The "cleavage direction" of the semiconductor wafer W mentioned herein is the direction of a line where a cleavage surface of a monocrystalline silicon ingot from which the semiconductor wafer W is cut out and the semiconductor wafer W cross each other. The semiconductor wafer W cracks relatively easily in the cleavage direction. Where the semiconductor wafer W warps about a radius at an angle of 45 degrees with respect to the cleavage direction during irradiation with flashes, a portion to become the lowest position as a result of the warpage of the semiconductor wafer W is specified.

The present invention has been made based on the aforementioned knowledge. A semiconductor wafer W is placed on the susceptor 74 such that any of the eight support pins 77 supports a radius connecting a portion to become the lowest position when the semiconductor wafer W warps during irradiation with flashes such that the upper surface thereof becomes convex and the center of the wafer W.

FIG. 10 explains the position of a semiconductor wafer W placed on the susceptor 74. In FIG. 10, directions along dotted straight lines show cleavage directions of the semiconductor wafer W. As shown in FIG. 10, the semiconductor wafer W with (100) plane orientation has two orthogonal cleavage directions. The semiconductor wafer W of 300 mm in diameter generally has a notch 9 provided as a cut to adjust the position of the wafer W. The alignment unit 130 detects the notch 9 optically to adjust the position of the semiconductor wafer W such that the semiconductor wafer W faces a predetermined direction. The notch 9 indicates one of the two cleavage directions of the semiconductor wafer W with (100) plane orientation.

Referring to FIG. 10, directions along straight lines with alternate long and short dashes show directions at an angle of 45 degrees with respect to the cleavage directions. As shown in FIG. 10, the semiconductor wafer W with (100) plane orientation has two orthogonal directions that are at an angle of 45 degrees with respect to the cleavage directions. During irradiation with flashes, the semiconductor wafer W warps about a radius indicated by a line with alternate long and short dashes of FIG. 10 such that the upper surface of the semiconductor wafer W becomes convex. Specifically, the semiconductor wafer W warps about only one of the two radii at an angle of 45 degrees with respect to the cleavage directions. Thus, the opposite ends of the other radius perpendicular to the former radius become the lowest position when the semiconductor wafer W warps during irradiation with flashes such that the upper surface thereof becomes convex.

Specifically, a portion to become the lowest position when the semiconductor wafer W warps during irradiation with flashes such that the upper surface thereof becomes convex is the opposite ends of one of the two radii at an angle of 45 degrees with respect to the cleavage directions. In this preferred embodiment, as shown in FIG. 10, the semiconductor wafer W is placed on the susceptor 74 such that any of the support pins 77 supports a radius connecting a portion to become the lowest position when the semiconductor wafer W warps during irradiation with flashes such that the upper surface thereof becomes convex and the center of the semiconductor wafer W, specifically a radius at an angle of 45 degrees with respect to a cleavage direction (line segment passing through the center of the semiconductor wafer W).

In this preferred embodiment, the eight support pins 77 are provided in upright position on the upper surface of the holding plate 75 of the susceptor 74 while being spaced at intervals of 45 degrees along the same circumference. Further, the semiconductor wafer W has two radii at an angle of 45 degrees with respect to the cleavage directions. Thus, the respective opposite ends of the radii at an angle of 45 degrees with respect to the cleavage directions of the semiconductor wafer W can be supported with four of the eight support pins 77 spaced at intervals of 45 degrees. Additionally, these radii are at an angle of 45 degrees with respect to radii in the cleavage directions. Thus, the respective opposite ends of the radii in the cleavage directions can also be supported with the remaining four of the eight support pins 77 spaced at intervals of 45 degrees.

In this preferred embodiment, the alignment unit 130 adjusts the position of a semiconductor wafer W transported into the chamber 6 by the transport robot 150 and placed onto the susceptor 74 by the transfer mechanism 10 such that the support pins 77 support the radii at an angle of 45 degrees with respect to the cleavage directions of the semiconductor wafer W. More specifically, the eight support pins 77 are provided in upright position on the susceptor 74 while being spaced at intervals of 45 degrees along the same circumference, and the notch 9 is provided in the semiconductor wafer W at one end of a radius in the cleavage direction. Thus, for adjustment of the position of the semiconductor wafer W, the alignment unit 130 has only to place the notch 9 at a position nearest any of the eight support pins 77.

When the semiconductor wafer W is placed on the susceptor 74 in a position that places the notch 9 at a position nearest any of the eight support pins 77, the radii at an angle of 45 degrees with respect to the cleavage directions of the semiconductor wafer W are supported with four support pins 77 as shown in FIG. 10. At the same time, the radii in the cleavage directions of the semiconductor wafer W are also supported with four support pins 77.

When the semiconductor wafer W placed on the susceptor 74 in a way shown in FIG. 10 is irradiated with flashes from the flash lamps FL, a large temperature difference occurs instantaneously between the upper and lower surfaces of the semiconductor wafer W. This makes only the upper surface of the semiconductor wafer W expand rapidly by heat, so that the semiconductor wafer W warps such that the upper surface thereof becomes convex. If a radius at an angle of 45 degrees with respect to a cleavage direction of the semiconductor wafer W is supported with multiple support pins 77 at this time, the end portion of the semiconductor wafer W is prevented from contacting the upper surface of the holding plate 75 as shown in FIG. 11. Specifically, any of the support pins 77 supports a radius connecting a portion to become the lowest position when the semiconductor wafer W warps during irradiation with flashes such that the upper surface thereof becomes convex and the center of the semiconductor wafer W. Thus, no end portion of the semiconductor wafer W will be below this portion so that no end portion of the semiconductor wafer W will contact the upper surface of the holding plate 75. Hence, warpage of the semiconductor wafer W generated during irradiation with flashes does not cause scraping of quartz forming the susceptor 74. This prevents damage on the susceptor 74 and prevents scattering of particles of scraped quartz.

Figure 12:
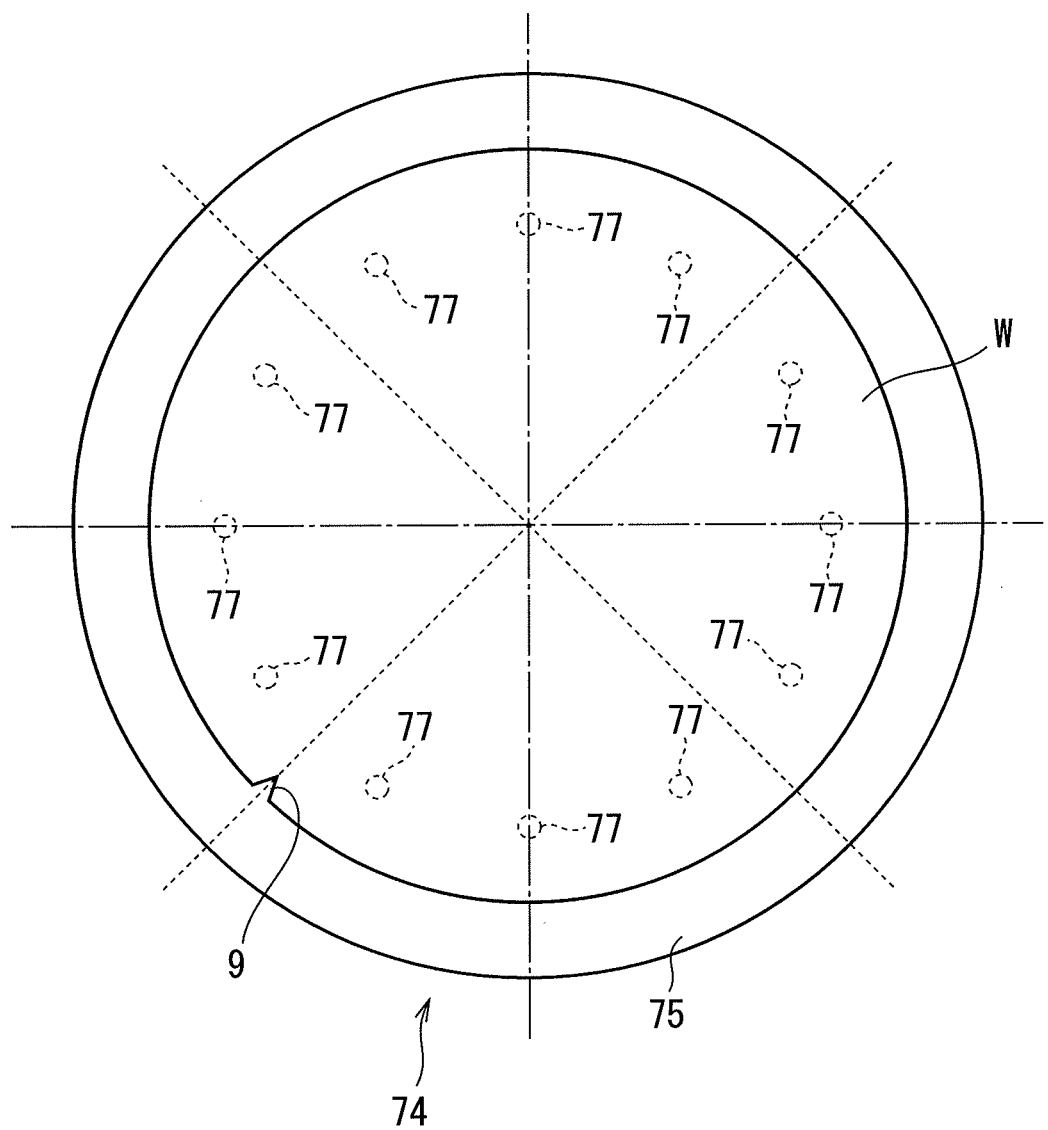
FIG. 12 shows an example where 12 support pins are provided on the susceptor.

In addition to the aforementioned preferred embodiment of the present invention, the present invention can be changed in various ways without departing from the scope of the invention. As an example, while the eight support pins 77 spaced at intervals of 45 degrees are shown in the aforementioned preferred embodiment, the number of the support pins 77 on the upper surface of the holding plate 75 of the susceptor 74 is not limited to eight. FIG. 12 shows an example where 12 support pins 77 are provided on the susceptor 74. Like in FIG. 10, directions along dotted straight lines show cleavage directions of a semiconductor wafer W. The semiconductor wafer W with (100) plane orientation has two orthogonal cleavage directions, and a notch 9 is formed so as to indicate one of these cleavage directions. In FIG. 12, directions along straight lines with alternate long and short dashes also show directions at an angle of 45 degrees with respect to the cleavage directions. During irradiation with flashes, the semiconductor wafer W warps about one of two radii indicated by the lines with alternate long and short dashes of FIG. 12 such that the upper surface thereof becomes convex whereas the opposite ends of the other radius become the lowest position.

In the example of FIG. 12, the 12 support pins 77 in total are provided in upright position on the upper surface of the holding plate 75 of the susceptor 74 while being spaced at intervals of 30 degrees along the circumference of a circle concentric with the outer circumferential circle of the holding plate 75. The diameter of the circle along which the 12 support pins 77 are arranged is smaller than the diameter of the semiconductor wafer W and is two-thirds or more of the diameter of the semiconductor wafer W. The semiconductor wafer W is placed on the susceptor 74 of FIG. 12 such that any of the 12 support pins 77 supports a radius connecting a portion to become the lowest position when the semiconductor wafer W warps during irradiation with flashes such that the upper surface thereof becomes convex and the center of the semiconductor wafer W, specifically a radius at an angle of 45 degrees with respect to a cleavage direction.

As described above, the semiconductor wafer W has two radii at an angle of 45 degrees with respect to the cleavage directions of the semiconductor wafer W, and four of the 12 support pins 77 spaced at intervals of 30 degrees support the respective opposite ends of the radii at an angle of 45 degrees with respect to the cleavage directions of the semiconductor wafer W. Like in the aforementioned preferred embodiment, when the semiconductor wafer W is transported into the chamber 6 by the transport robot 150 and placed onto the susceptor 74 by the transfer mechanism 10, the alignment unit 130 adjusts the position of the semiconductor wafer W such that the support pins 77 support the radii at an angle of 45 degrees with respect to the cleavage directions of the semiconductor wafer W on the susceptor 74. More specifically, for adjustment of the position of the semiconductor wafer W, the alignment unit 130 has only to place the notch 9 of the semiconductor wafer W at an intermediate position between adjacent ones of the support pins 77.

During irradiation with flashes in the aforementioned way, the radius at an angle of 45 degrees with respect to the cleavage direction of the semiconductor wafer W is still supported with multiple support pins 77. This prevents the end portion of the semiconductor wafer W from contacting the upper surface of the holding plate 75 (see FIG. 11). Hence, warpage of the semiconductor wafer W generated during irradiation with flashes does not cause scraping of quartz forming the susceptor 74. This prevents damage on the susceptor 74 and prevents scattering of particles of scraped quartz.

A semiconductor wafer W with (100) plane orientation has two radii at an angle of 45 degrees with respect to cleavage directions. Supporting at least the respective opposite ends of these two radii with the support pins 77 prevents the end portion of the semiconductor wafer W from contacting the upper surface of the holding plate 75 of the susceptor 74 during irradiation with flashes. Specifically, providing at least four support pins 77 on the upper surface of the holding plate 75 of the susceptor 74 spaced at intervals of 90 degrees along the same circumference prevents the end portion of the semiconductor wafer W from contacting the susceptor 74 during irradiation with flashes.

Accordingly, the number of the support pins 77 on the upper surface of the holding plate 75 equally spaced along the same circumference may be a multiple of four. However, if there are not many support pins 77, it becomes hard to support a semiconductor wafer W stably when the semiconductor wafer W warps during irradiation with flashes. Meanwhile, the temperature of the semiconductor wafer W tends to be lower locally in an area contacting the quartz support pin 77 that hardly absorbs light during thermal processing than in a surrounding area. Hence, providing too many support pins 77 might impair uniformity of an in-plane temperature distribution of the semiconductor wafer W. Thus, it is preferable that the number of the support pins 77 on the susceptor 74 be eight or 12.

A semiconductor wafer W with (100) plane orientation is described as a target wafer in the aforementioned preferred embodiment. However, this is not the only target semiconductor wafer W but the target semiconductor wafer W may also have different plane orientation. As described above, three types of wafers are generally used including a wafer with (100) plane orientation, a wafer with (110) plane orientation, and a wafer with (111) plane orientation. A target semiconductor wafer W may also have (110) plane orientation or (111) plane orientation. A semiconductor wafer W with (110) plane orientation or (111) plane orientation behaves differently from a semiconductor wafer W with (100) plane orientation in terms of deformation occurring during irradiation with flashes. However, an end portion of a semiconductor wafer W with (110) plane orientation or (111) plane orientation is still prevented from contacting the susceptor 74 if the semiconductor wafer W is placed on the susceptor 74 such that any of the support pins 77 supports a radius connecting a portion to become the lowest position when the semiconductor wafer W warps during irradiation with flashes such that the upper surface thereof becomes convex and the center of the wafer W.

In the aforementioned preferred embodiment, a semiconductor wafer W has the notch 9 provided to adjust the position of the semiconductor wafer W. The notch 9 may be replaced by an orientation flat.

In the aforementioned preferred embodiment, a semiconductor wafer W is preheated by irradiation with light from the halogen lamps HL. Instead, a susceptor to hold a semiconductor wafer W may be placed on a hot plate and the semiconductor wafer W may be preheated by heat transferred from the hot plate.

In the aforementioned preferred embodiment, 30 flash lamps FL are provided in the flash lamp house 5. However, the number of the flash lamps FL is not limited to 30 but it can be determined arbitrarily. Further, the flash lamps FL are not limited to xenon flash lamps but they may also be krypton flash lamps. Additionally, the number of the halogen lamps HL in the halogen lamp house 4 is not limited to 40 but it can be determined arbitrarily.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus that heats a substrate of a circular plate shape by irradiating the substrate with a flash, the thermal processing apparatus comprising:
    an alignment mechanism that adjusts the position of a substrate;
    a susceptor on which a plurality of support pins is provided in upright position, the susceptor holding said substrate placed thereon while supporting a lower surface of said substrate with said support pins;
    a transport unit that transports said substrate from said alignment mechanism to said susceptor; and
    a flash lamp that heats said substrate placed on said susceptor by irradiating an upper surface of said substrate with a flash,
    wherein
    said substrate is a monocrystalline silicon semiconductor wafer with (100) plane orientation, and
    said alignment mechanism is configured to adjust the position of said substrate such that any of said support pins supports all of the respective opposite ends of two radii of said substrate at an angle of 45 degrees with respect to a cleavage direction of said substrate, said cleavage direction being a direction of a line where a cleavage surface of a monocrystalline silicon ingot from which said substrate is cut out and said substrate cross each other.

2. The thermal processing apparatus according to claim 1, wherein said susceptor includes at least four support pins spaced at intervals of 90 degrees along the same circumference.

3. The thermal processing apparatus according to claim 2, wherein said susceptor includes eight support pins spaced at intervals of 45 degrees along said circumference.

4. The thermal processing apparatus according to claim 2, wherein said susceptor includes 12 support pins spaced at intervals of 30 degrees along said circumference.

5. The thermal processing apparatus according to claim 2, wherein the diameter of said circumference is two-thirds or more of the diameter of said substrate.

* * * * *